United States Patent
Nakamura et al.

(10) Patent No.: US 9,269,624 B2
(45) Date of Patent: Feb. 23, 2016

(54) WAFER PROCESSING METHOD

(71) Applicant: DISCO CORPORATION, Tokyo (JP)

(72) Inventors: Masaru Nakamura, Tokyo (JP); Kimitake Mantoku, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 14/736,872

(22) Filed: Jun. 11, 2015

(65) Prior Publication Data

US 2015/0364375 A1    Dec. 17, 2015

(30) Foreign Application Priority Data

Jun. 12, 2014  (JP) ................................. 2014-121256

(51) Int. Cl.

| H01L 21/00 | (2006.01) |
|---|---|
| H01L 21/78 | (2006.01) |
| H01L 21/683 | (2006.01) |
| H01L 21/304 | (2006.01) |
| H01L 21/268 | (2006.01) |

(52) U.S. Cl.
CPC .............. *H01L 21/78* (2013.01); *H01L 21/268* (2013.01); *H01L 21/304* (2013.01); *H01L 21/6836* (2013.01); *H01L 2221/68336* (2013.01); *H01L 2221/68381* (2013.01)

(58) Field of Classification Search
None
See application file for complete search history.

(56) References Cited

U.S. PATENT DOCUMENTS

| 2006/0216911 A1* | 9/2006 | Yoshikawa | B23K 26/40 438/460 |
|---|---|---|---|
| 2009/0091044 A1* | 4/2009 | Seo | H01L 21/6835 257/790 |
| 2010/0129546 A1* | 5/2010 | Kitahara | H01L 21/6715 427/240 |
| 2011/0059620 A1* | 3/2011 | Kitahara | H01L 21/56 438/782 |
| 2013/0087947 A1* | 4/2013 | Kitahara | H01L 21/78 264/400 |
| 2015/0104930 A1* | 4/2015 | Aikawa | H01L 21/78 438/462 |

FOREIGN PATENT DOCUMENTS

| JP | 2002-192370 | 7/2002 |
|---|---|---|
| JP | 2003-007648 | 1/2003 |
| JP | 2005-223282 | 8/2005 |
| JP | 2008-235650 | 10/2008 |

* cited by examiner

*Primary Examiner* — Angel Roman
(74) *Attorney, Agent, or Firm* — Greer Burns & Crain, Ltd.

(57) ABSTRACT

Disclosed herein is a wafer processing method including a wafer supporting step of mounting an adhesive film for die bonding on the back side of a wafer, attaching a dicing tape to the adhesive film, and supporting the peripheral portion of the dicing tape to an annular frame, wherein the wafer has already been divided into individual device chips along division lines formed on the front side or a break start point has already been formed inside the wafer along each division line, a protective film forming step of applying a water-soluble resin to the front side of the wafer and/or the peripheral portion of the adhesive film projecting from the outer circumference of the wafer, thereby forming a protective film from the water-soluble resin, and an adhesive film breaking step of expanding the dicing tape to thereby break the adhesive film along the individual device chips.

5 Claims, 15 Drawing Sheets

WAFER PROCESSING METHOD

BACKGROUND OF THE INVENTION

1. Field of the Invention

The present invention relates to a wafer processing method of dividing a wafer into a plurality of individual device chips along a plurality of crossing division lines and mounting an adhesive film for die bonding on the back side of each device chip, the plurality of crossing division lines being formed on the front side of the wafer to thereby define a plurality of separate regions where a plurality of devices are respectively formed.

2. Description of the Related Art

In a semiconductor device chip fabrication process, a plurality of crossing division lines are formed on the front side of a substantially disk-shaped semiconductor wafer to thereby define a plurality of separate regions where a plurality of devices such as ICs and LSIs are respectively formed, and these regions are divided from each other along the division lines to thereby produce a plurality of individual semiconductor device chips. As a dividing apparatus for dividing the semiconductor wafer into the individual semiconductor device chips, a dicing saw is generally used. The dicing saw includes a cutting blade having a thickness of about 20 µm to 30 µm for cutting the semiconductor wafer along the division lines. The semiconductor device chips thus obtained are packaged to be widely used in electric equipment such as mobile phones and personal computers.

As a technique of dividing the semiconductor wafer into the individual semiconductor device chips, a so-called dicing before grinding process has been put to practical use. This dicing before grinding process includes the steps of forming a kerf (division groove) having a predetermined depth (corresponding to the finished thickness of each semiconductor device chip) along each division line on the front side of the semiconductor wafer and next grinding the back side of the semiconductor wafer to expose each kerf to the back side of the semiconductor wafer, thereby dividing the semiconductor wafer into the individual semiconductor device chips. By this dicing before grinding process, the thickness of each semiconductor device chip can be reduced to 50 µm or less (see Japanese Patent Laid-open No. 2003-7648, for example).

As another technique of dividing the semiconductor wafer into the individual device chips, a laser processing method called internal processing has also been put to practical use. This laser processing method uses a pulsed laser beam having a transmission wavelength to the wafer, wherein the pulsed laser beam is applied to the wafer in the condition where the focal point of the pulsed laser beam is set inside the wafer in a subject area to be divided. That is, the wafer dividing method using this laser processing method called internal processing includes the steps of applying a pulsed laser beam having a transmission wavelength to the wafer from the back side of the wafer in the condition where the focal point of the pulsed laser beam is set inside the wafer, thereby continuously forming a modified layer inside the wafer along each division line, and next applying an external force to the wafer along each division line where the modified layer is formed to be reduced in strength, thereby breaking the wafer along each division line to obtain the individual device chips (see Japanese Patent No. 3408805, for example).

An adhesive film for die bonding called a die attach film (DAF) having a thickness of 20 µm to 40 µm is mounted on the back side of each semiconductor device chip, and each semiconductor device chip is bonded through the adhesive film to a die bonding frame for supporting the semiconductor device chip by heating. The adhesive film is formed of polyimide resin, epoxy resin, or acrylic resin, for example.

However, in the condition where the adhesive film for die bonding is mounted on the back side of the semiconductor wafer, the back side of the wafer cannot be ground in the dicing before grinding process mentioned above or the laser beam cannot be applied to the wafer from the back side thereof in the laser processing method mentioned above. To solve this problem, there has been proposed a method including the steps of mounting an adhesive film for die bonding on the back side of a semiconductor wafer divided into individual semiconductor device chips, attaching the adhesive film to a dicing tape, and expanding the dicing tape to thereby break the adhesive film along the individual semiconductor device chips (see Japanese Patent Laid-open Nos. 2005-223282 and 2008-235650, for example).

SUMMARY OF THE INVENTION

However, in the case of mounting the adhesive film on the back side of the semiconductor wafer divided into the individual semiconductor device chips, next attaching the adhesive film to the dicing tape, and next expanding the dicing tape to thereby break the adhesive film along the individual semiconductor device chips as mentioned above, there is a problem such that since the adhesive film has a size slightly larger than the size of the semiconductor wafer, the peripheral portion of the adhesive film may be finely crushed to scatter in the step of breaking the adhesive film, so that a crushed part of the peripheral portion of the adhesive film may stick to the front side of the semiconductor device chips.

Furthermore, there is a possibility that such a crushed part of the adhesive film may stick to electrodes exposed to the front side of the semiconductor device chips, causing the hindrance of wire bonding and the occurrence of faulty continuity to result in a reduction in quality of the semiconductor device chips.

It is therefore an object of the present invention to provide a wafer processing method which can solve the problem that the finely crushed part of the adhesive film for die bonding may directly stick to the front side of the semiconductor device chips in the step of breaking the adhesive film along the individual semiconductor device chips, wherein the adhesive film is mounted on the back side of a semiconductor wafer previously divided into the individual semiconductor device chips along the division lines or previously formed with a modified layer as a break start point along each division line.

In accordance with an aspect of the present invention, there is provided a wafer processing method of dividing a wafer into a plurality of individual device chips along a plurality of crossing division lines and mounting an adhesive film for die bonding on a back side of each device chip, the plurality of crossing division lines being formed on a front side of the wafer to thereby define a plurality of separate regions where a plurality of devices are respectively formed, the wafer processing method including: a wafer supporting step of mounting the adhesive film on the back side of the wafer, attaching a dicing tape to the adhesive film, and supporting a peripheral portion of the dicing tape to an annular frame, wherein the wafer has already been divided along the division lines or a break start point has already been formed inside the wafer along each division line; a protective film forming step of applying a water-soluble resin to the front side of the wafer and/or a peripheral portion of the adhesive film projecting from an outer circumference of the wafer, thereby forming a protective film from the water-soluble resin; and an adhesive film breaking step of expanding the dicing tape to thereby break the adhesive film along the individual device chips after performing the protective film forming step.

Preferably, the wafer processing method further includes a division groove forming step of forming a division groove having a depth corresponding to a finished thickness of each device chip along each division line on the front side of the wafer before performing the adhesive film breaking step; a protective member attaching step of attaching a protective member to the front side of the wafer after performing the division groove forming step; and a back grinding step of grinding the back side of the wafer until the division groove extending along each division line is exposed to the back side of the wafer after performing the protective member attaching step, thereby dividing the wafer into the individual device chips.

Preferably, the protective film forming step is performed between the division groove forming step and the protective member attaching step. Preferably, the wafer processing method further includes a modified layer forming step of applying a laser beam having a transmission wavelength to the wafer from the back side of the wafer along each division line in a condition where a focal point of the laser beam is set inside the wafer to thereby form a modified layer as the break start point inside the wafer along each division line before performing the wafer supporting step. Preferably, the wafer processing method further includes a protective film removing step of supplying a cleaning water to the protective film after performing the adhesive film breaking step, thereby removing the protective film.

According to the wafer processing method of the present invention, the following effects can be obtained. In the case that the protective film is formed on the front side of the wafer, a part of the peripheral portion of the adhesive film crushed to scatter in the adhesive film breaking step sticks to the front side of the protective film formed on the front side of the device chips and does not directly stick to the front side of the device chips. Accordingly, by removing the protective film formed on the front side of the device chips in the next protective film removing step, the crushed part sticking to the protective film can be removed together with the protective film, thereby preventing a reduction in quality of the device chips.

Further, in the case that the protective film is formed on the peripheral portion of the adhesive film projecting from the outer circumference of the wafer, a crushed part of the peripheral portion of the adhesive film in the adhesive film breaking step does not scatter because the peripheral portion of the adhesive film is fully covered with the protective film. Accordingly, there is no possibility that the crushed part of the peripheral portion of the adhesive film may stick to the front side of the device chips. Further, in the case that the protective film is formed on both the front side of the wafer and the peripheral portion of the adhesive film projecting from the outer circumference of the wafer, the effects in both cases mentioned above can be obtained.

Accordingly, there is no possibility that the crushed part of the adhesive film may stick to the electrodes exposed to the front side of the device chips, causing the hindrance of wire bonding and the occurrence of faulty continuity to result in a reduction in quality of the device chips.

The above and other objects, features and advantages of the present invention will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
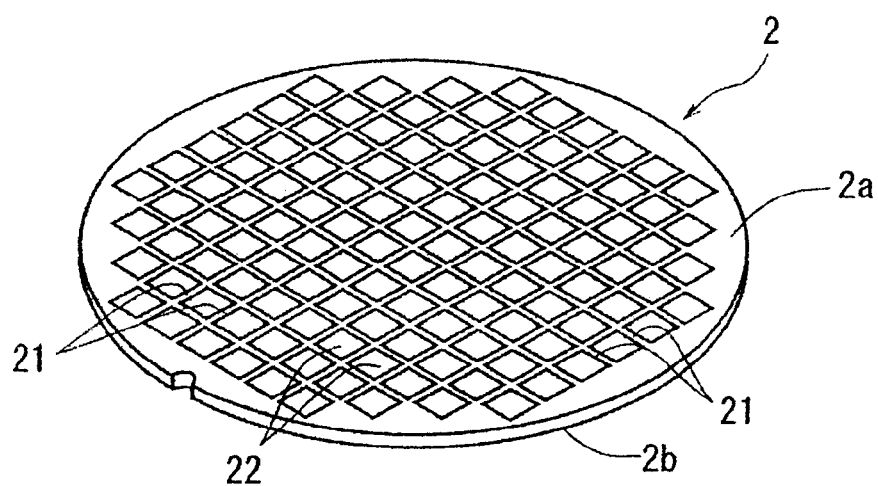
FIG. 1 is a perspective view of a semiconductor wafer.

A preferred embodiment of the wafer processing method according to the present invention will now be described in detail with reference to the attached drawings. FIG. 1 is a perspective view of a semiconductor wafer 2. The semiconductor wafer 2 shown in FIG. 1 is formed from a silicon wafer having a thickness of 500 µm, for example. The semiconductor wafer 2 has a front side 2a and a back side 2b. A plurality of crossing division lines 21 are formed on the front side 2a of the semiconductor wafer 2 to thereby define a plurality of separate regions where a plurality of devices 22 such as ICs and LSIs are respectively formed. There will now be described a wafer processing method of dividing the semiconductor wafer 2 along the division lines 21 to obtain a plurality of individual device chips respectively corresponding to the plural devices 22 and mounting an adhesive film for die bonding on the back side of each device chip.

First, there will now be described a method of dividing the semiconductor wafer 2 into the individual device chips by using a so-called dicing before grinding process. In the method of dividing the semiconductor wafer 2 into the individual device chips by using the dicing before grinding process, a division groove having a predetermined depth (corresponding to the finished thickness of each device chip) is formed along each division line 21 on the front side 2a of the semiconductor wafer 2 (division groove forming step). This division groove forming step is performed by using a cutting apparatus 3 shown in FIG. 2A. The cutting apparatus 3 shown in FIG. 2A includes a chuck table 31 for holding a workpiece, cutting means 32 for cutting the workpiece held on the chuck table 31, and imaging means 33 for imaging the workpiece held on the chuck table 31. The chuck table 31 has an upper surface for holding the workpiece under suction. The chuck table 31 is movable both in a feeding direction shown by an arrow X in FIG. 2A by a feeding mechanism (not shown) and in an indexing direction shown by an arrow Y in FIG. 2A by an indexing mechanism (not shown).

The cutting means 32 includes a spindle housing 321 extending in a substantially horizontal direction, a rotating spindle 322 rotatably supported to the spindle housing 321, and a cutting blade 323 mounted on the front end portion of the rotating spindle 322. The rotating spindle 322 is rotatable in the direction shown by an arrow 322a by a servo motor (not shown) provided in the spindle housing 321. The thickness of the cutting blade 323 is set to 30 μm, for example. The imaging means 33 is mounted on the front end portion of the spindle housing 321 and includes illuminating means for illuminating the workpiece, an optical system for capturing an area illuminated by the illuminating means, and an imaging device (CCD) for detecting an image in the area captured by the optical system. An image signal output from the imaging means 33 is transmitted to control means (not shown).

Figure 2A:
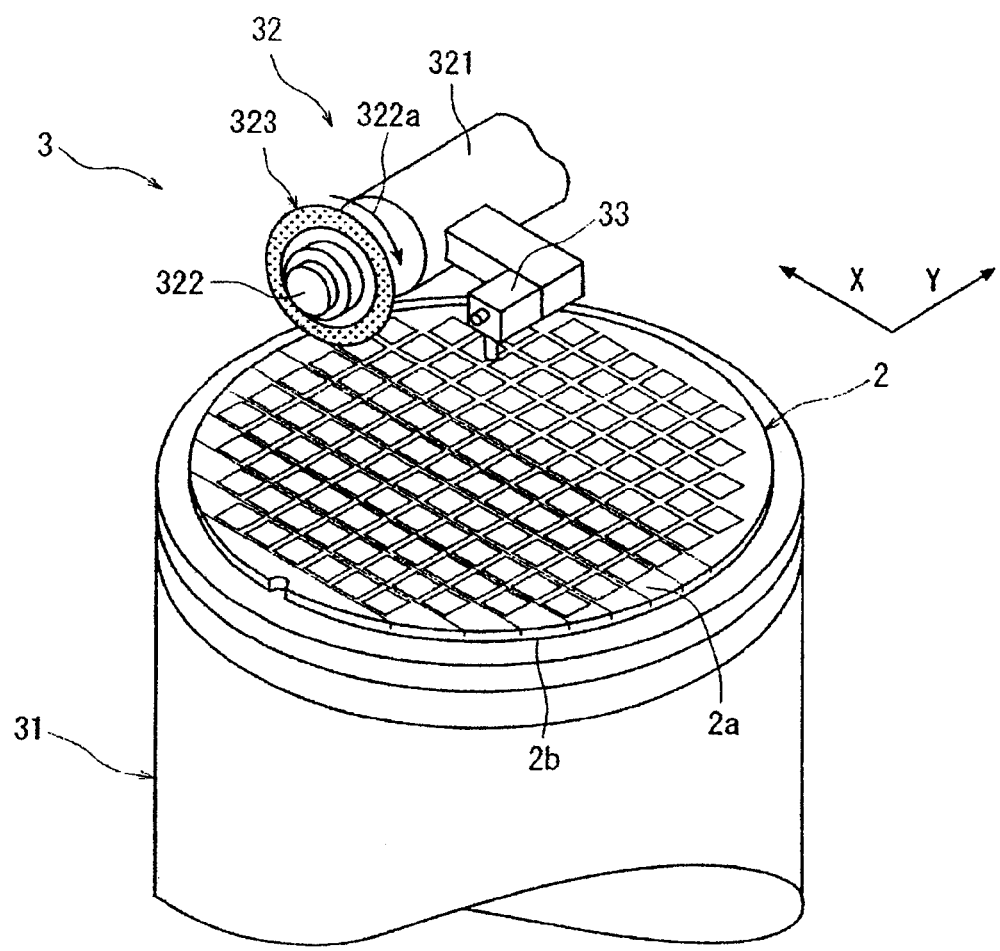
FIGS. 2A and 2B are views for illustrating a division groove forming step.

In performing the division groove forming step by using the cutting apparatus 3 mentioned above, the semiconductor wafer 2 is placed on the chuck table 31 in the condition where the back side 2b of the semiconductor wafer 2 is in contact with the upper surface of the chuck table 31 as shown in FIG. 2A. Thereafter, suction means (not shown) is operated to hold the semiconductor wafer 2 on the chuck table 31 under suction. Accordingly, the semiconductor wafer 2 is held on the chuck table 31 under suction in the condition where the front side 2a of the semiconductor wafer 2 is oriented upward. Thereafter, the chuck table 31 holding the semiconductor wafer 2 is moved to a position directly below the imaging means 33 by operating the feeding mechanism (not shown).

In the condition where the chuck table 31 is positioned directly below the imaging means 33, an alignment operation is performed by the imaging means 33 and the control means (not shown) to detect a cutting area where the division groove is to be formed along each division line 21 of the semiconductor wafer 2. More specifically, the imaging means 33 and the control means (not shown) perform image processing such as pattern matching for making the alignment between the cutting blade 323 and the division lines 21 extending in a first direction on the semiconductor wafer 2, thereby performing the alignment for the cutting area (alignment step). This alignment step is similarly performed for the other division lines 21 extending in a second direction perpendicular to the first direction on the semiconductor wafer 2.

Figure 2B:
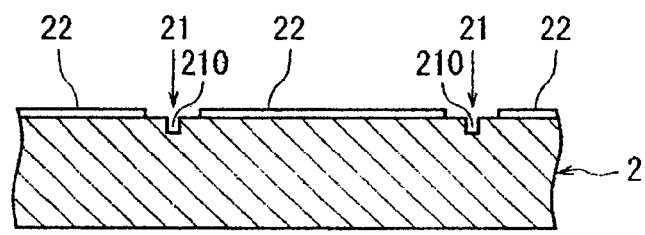

After performing the alignment step mentioned above to detect the cutting area along all of the division lines 21 of the semiconductor wafer 2 held on the chuck table 31, the chuck table 31 holding the semiconductor wafer 2 is moved to a cutting start position where one end of a predetermined one of the division lines 21 is positioned directly below the cutting blade 323. At this cutting start position, the cutting blade 323 is rotated in the direction of the arrow 322a in FIG. 2A and then lowered to cut into the semiconductor wafer 2. The depth of cut by the cutting blade 323 into the semiconductor wafer 2 is set so that the outer circumference of the cutting blade 323 reaches a predetermined depth (e.g., 50 μm) corresponding to the finished thickness of each device chip as measured from the front side 2a of the semiconductor wafer 2. Thereafter, the chuck table 31 is fed in the direction of the arrow X in FIG. 2A as rotating the cutting blade 323, thereby forming a division groove 210 along the predetermined division line 21 on the front side 2a of the semiconductor wafer 2 as shown in FIG. 2B, wherein the division groove 210 has a width of 30 μm and a depth of 50 μm, for example, corresponding to the finished thickness of each device chip (division groove forming step). This division groove forming step is similarly performed along all of the other division lines 21 to form similar division grooves 210.

Figure 3A:
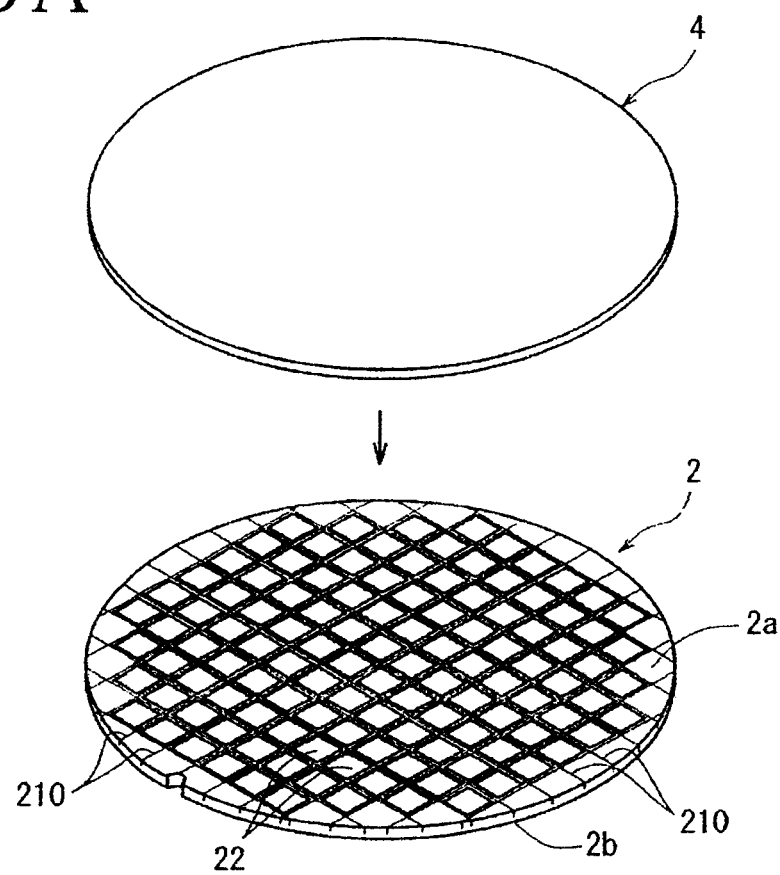
FIGS. 3A and 3B are perspective views for illustrating a protective member attaching step.
Figure 3B:
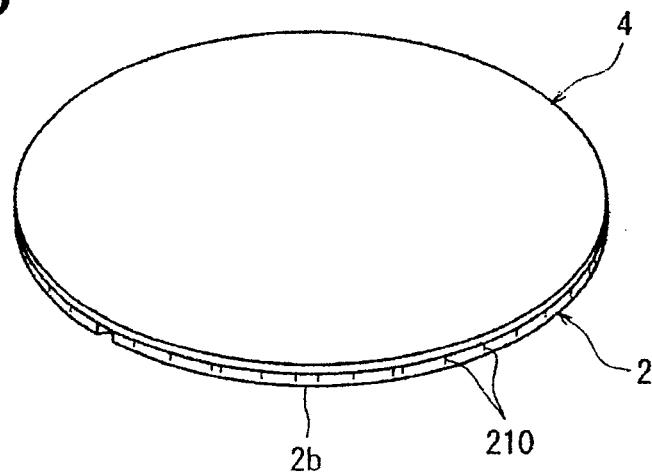

After performing the division groove forming step mentioned above, a protective member attaching step is performed in such a manner that a protective member is attached to the front side 2a of the semiconductor wafer 2. More specifically, as shown in FIGS. 3A and 3B, a protective tape 4 as the protective member is attached to the front side 2a of the semiconductor wafer 2. The protective tape 4 is composed of a base sheet and an adhesive layer formed on the base sheet. For example, the base sheet is formed of polyvinyl chloride (PVC) and has a thickness of 100 μm, and the adhesive layer is formed of acrylic resin and has a thickness of about 5 μm.

After performing the protective member attaching step, a back grinding step is performed in such a manner that the back side 2b of the semiconductor wafer 2 is ground as supplying a grinding water to reduce the thickness of the wafer 2 to a predetermined thickness until the division grooves 210 are exposed to the back side 2b of the wafer 2, thereby dividing the semiconductor wafer 2 into the individual device chips. This back grinding step is performed by using a grinding apparatus 5 shown in FIG. 4A. The grinding apparatus 5 shown in FIG. 4A includes a chuck table 51 as holding means for holding a workpiece and grinding means 52 for grinding the workpiece held on the chuck table 51. The chuck table 51 has an upper surface for holding the workpiece under suction. The chuck table 51 is rotatable in the direction shown by an arrow A in FIG. 4A by a rotationally driving mechanism (not shown). The grinding means 52 includes a spindle housing 531, a rotating spindle 532 rotatably supported to the spindle housing 531 and adapted to be rotated in the direction shown by an arrow B in FIG. 4A by a rotationally driving mechanism (not shown), a mounter 533 fixed to the lower end of the rotating spindle 532, and a grinding wheel 534 mounted on the lower surface of the mounter 533. The grinding wheel 534 is composed of an annular base 535 and a plurality of abrasive members 536 fixed to the lower surface of the annular base 535 so as to be annularly arranged along the outer circumference thereof. The annular base 535 is mounted on the lower surface of the mounter 533 by a plurality of fastening bolts 537. Although not shown, a grinding water passage is formed in the rotating spindle 532 along the axis thereof, so that a grinding water is supplied through the grinding water passage to a grinding area to be ground by the abrasive members 536.

Figure 4A:
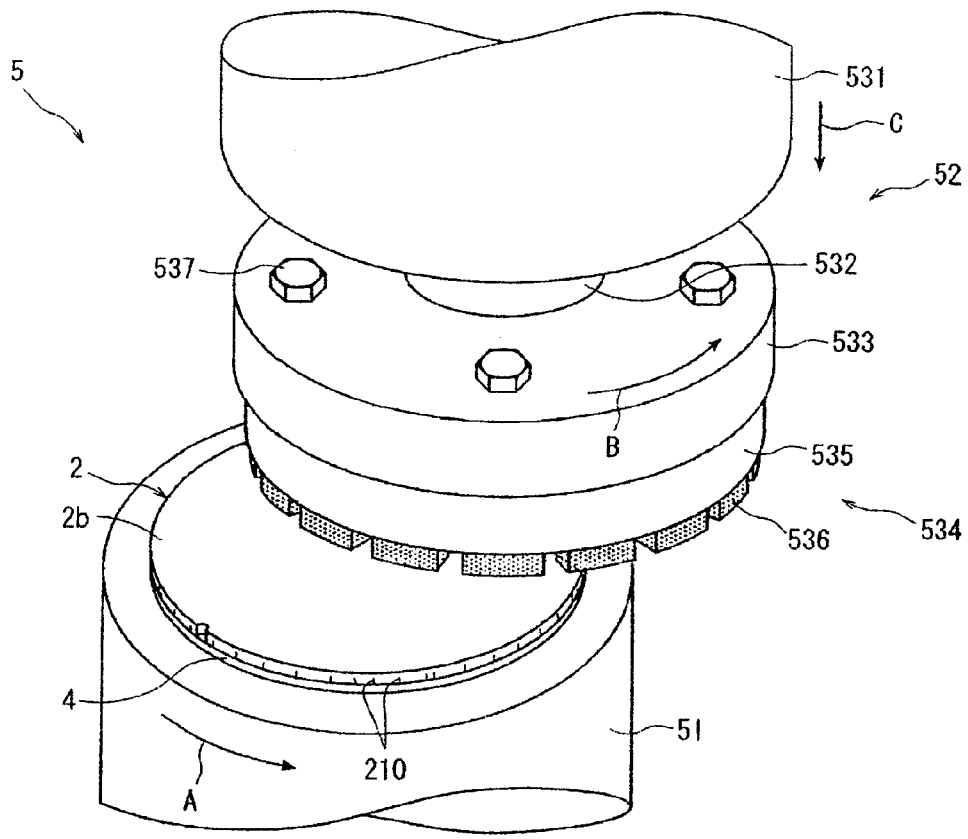
FIGS. 4A and 4B are views for illustrating a back grinding step.
Figure 4B:
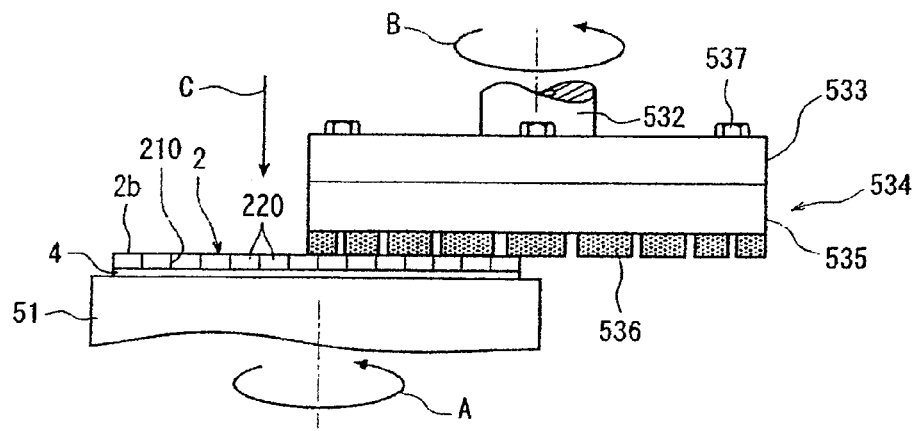

In performing the back grinding step by using the grinding apparatus 5 mentioned above, the semiconductor wafer 2 is placed on the chuck table 51 in the condition where the protective tape 4 attached to the front side 2a of the semiconductor wafer 2 is in contact with the upper surface (holding surface) of the chuck table 51 as shown in FIG. 4A. Thereafter, suction means (not shown) is operated to hold the semiconductor wafer 2 through the protective tape 4 on the chuck table 51 under suction (wafer holding step). Accordingly, the semiconductor wafer 2 is held through the protective tape 4 on the chuck table 51 under suction in the condition where the back side 2b of the semiconductor wafer 2 is oriented upward. After holding the semiconductor wafer 2 through the protective tape 4 on the chuck table 51 under suction as mentioned above, the chuck table 51 is rotated in the direction of the arrow A in FIG. 4A at 300 rpm, for example. At the same time, the grinding wheel 534 of the grinding means 52 is also rotated in the direction of the arrow B in FIG. 4A at 6000 rpm, for example. Thereafter, the grinding means 52 is lowered to bring the abrasive members 536 of the grinding wheel 534 into contact with the back side 2b (work surface) of the semiconductor wafer 2. Thereafter, the grinding wheel 534 is fed (lowered) in the direction shown by an arrow C in FIG. 4B (in the direction perpendicular to the holding surface of the chuck table 51) by a predetermined amount at a feed speed of 1 μm/second, for example. Accordingly, the back side 2b of the semiconductor wafer 2 is ground until the division grooves 210 are exposed, so that the semiconductor wafer 2 is divided into a plurality of individual device chips 220 along the division grooves 210 as shown in FIG. 4B. At this time, the individual device chips 220 are kept in the form of the semiconductor wafer 2 because the protective tape 4 is attached to the front side of these device chips 220.

Figure 5A:
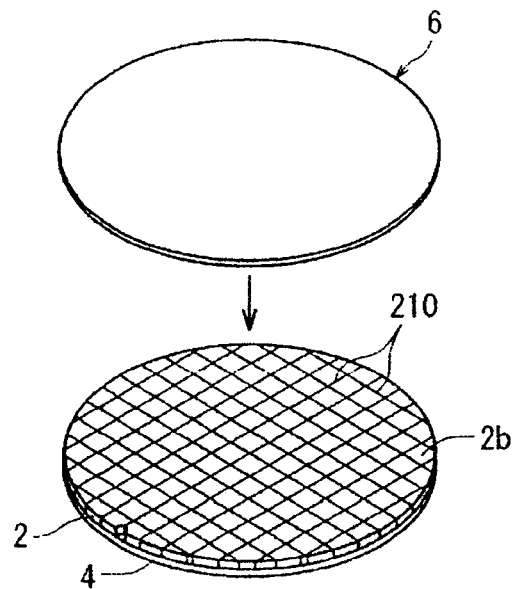
FIGS. 5A to 5C are perspective views for illustrating a first preferred embodiment of a wafer supporting step.
Figure 5B:
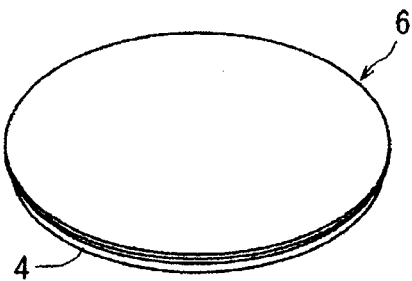
Figure 5C:
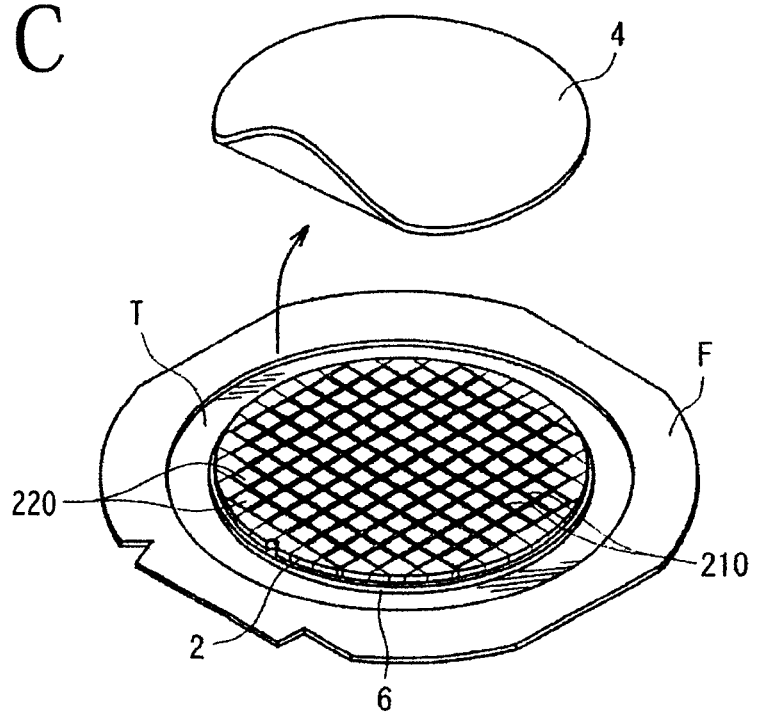

After performing the back grinding step mentioned above, a wafer supporting step is performed in such a manner that an adhesive film is mounted on the back side 2b of the semiconductor wafer 2, a dicing tape is attached to the adhesive film, and the peripheral portion of the dicing tape is supported to an annular frame. A first preferred embodiment of the wafer supporting step will now be described with reference to FIGS. 5A to 5C. As shown in FIGS. 5A and 5B, an adhesive film 6 is mounted on the back side 2b of the semiconductor wafer 2 (adhesive film mounting step). The adhesive film 6 must be reliably mounted on the entire surface of the back side 2b of the semiconductor wafer 2, so that the adhesive film 6 has a size slightly larger than the size of the semiconductor wafer 2. After mounting the adhesive film 6 on the back side 2b of the semiconductor wafer 2 as mentioned above, the adhesive film 6 mounted on the back side 2b of the semiconductor wafer 2 is attached to an expansible dicing tape T supported at its peripheral portion to an annular frame F as shown in FIG. 5C. Thereafter, the protective tape 4 attached to the front side 2a of the semiconductor wafer 2 is peeled off as shown in FIG. 5C (protective member peeling step). While the adhesive film 6 mounted on the back side 2b of the semiconductor wafer 2 is attached to the dicing tape T supported to the annular frame F in the first preferred embodiment shown in FIGS. 5A to 5C, the dicing tape T may be attached to the adhesive film 6 mounted on the back side 2b of the semiconductor wafer 2, and at the same time the peripheral portion of the dicing tape T may be supported to the annular frame F.

A second preferred embodiment of the wafer supporting step will now be described with reference to FIGS. 6A and 6B.

Figure 6A:
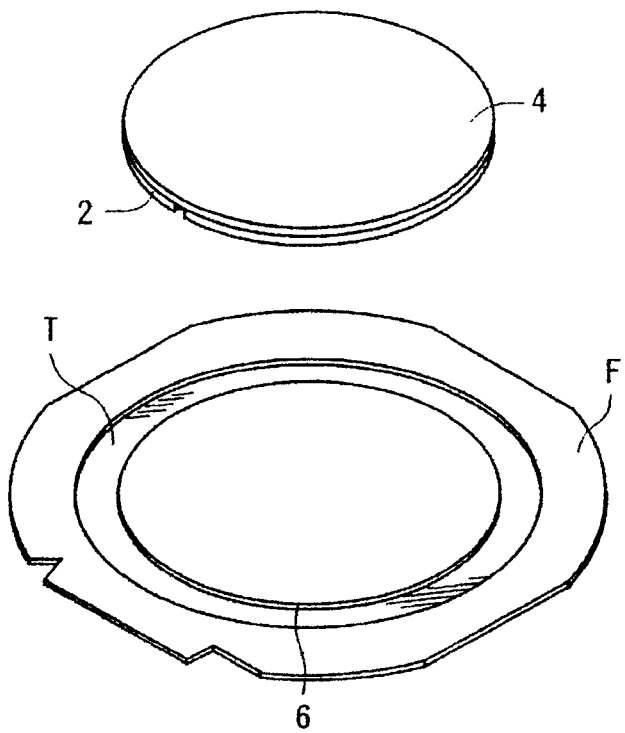
FIGS. 6A and 6B are perspective views for illustrating a second preferred embodiment of the wafer supporting step.
Figure 6B:
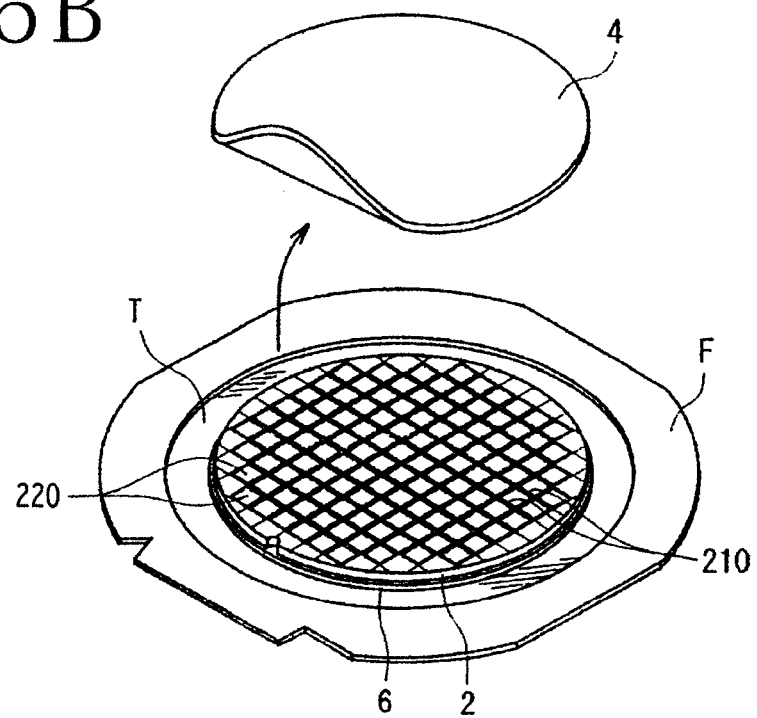

In the second preferred embodiment shown in FIGS. 6A and 6B, an adhesive film 6 is preliminarily attached to a dicing tape T to prepare a dicing tape with adhesive film. More specifically, as shown in FIG. 6A, the dicing tape T is preliminarily supported at its peripheral portion to an annular frame F so as to close the central opening of the annular frame F, and the adhesive film 6 is preliminarily attached to the dicing tape T exposed to the central opening of the annular frame F. Thereafter, as shown in FIG. 6B, the back side 2b of the semiconductor wafer 2 is mounted on the adhesive film 6 attached to the dicing tape T supported to the annular frame F, so that the semiconductor wafer 2 mounted on the adhesive film 6 is supported through the dicing tape T to the annular frame F. As similar to the first preferred embodiment, the adhesive film 6 preliminarily attached to the dicing tape T must be reliably mounted on the entire surface of the back side 2b of the semiconductor wafer 2, so that the adhesive film 6 in the second preferred embodiment also has a size slightly larger than the size of the semiconductor wafer 2. Thereafter, the protective tape 4 attached to the front side 2a of the semiconductor wafer 2 is peeled off as shown in FIG. 6B (protective member peeling step). While the back side 2b of the semiconductor wafer 2 is mounted on the adhesive film 6 attached to the dicing tape T supported to the annular frame F in the second preferred embodiment shown in FIGS. 6A and 6B, the adhesive film 6 attached to the dicing tape T may be mounted on the back side 2b of the semiconductor wafer 2, and at the same time the peripheral portion of the dicing tape T may be supported to the annular frame F.

The method of dividing the semiconductor wafer 2 by using the dicing before grinding process mentioned above may be replaced by a modified layer forming step of forming a break start point inside the semiconductor wafer 2 along each division line 21. This modified layer forming step is performed in such a manner that a laser beam having a transmission wavelength to the semiconductor wafer 2 is applied from the back side 2b of the semiconductor wafer 2 along each division line 21 in the condition where the focal point of the laser beam is set inside the semiconductor wafer 2 to thereby form a modified layer as the break start point inside the semiconductor wafer 2 along each division line 21. This modified layer forming step is performed by using a laser processing apparatus 7 shown in FIG. 7. The laser processing apparatus 7 shown in FIG. 7 includes a chuck table 71 for holding a workpiece, laser beam applying means 72 for applying a laser beam to the workpiece held on the chuck table 71, and imaging means 73 for imaging the workpiece held on the chuck table 71. The chuck table 71 has an upper surface as a holding surface for holding the workpiece under suction. The chuck table 71 is movable both in a feeding direction shown by an arrow X in FIG. 7 and in an indexing direction shown by an arrow Y in FIG. 7 by means of a moving mechanism (not shown).

The laser beam applying means 72 includes a cylindrical casing 721 extending in a substantially horizontal direction and focusing means 722 mounted on the front end of the casing 721 for applying a pulsed laser beam to the workpiece. The imaging means 73 is mounted on the front end portion of the casing 721 of the laser beam applying means 72. The imaging means 73 includes an ordinary imaging device (CCD) for imaging the workpiece by using visible light, infrared light applying means for applying infrared light to the workpiece, an optical system for capturing the infrared light applied to the workpiece by the infrared light applying means, and an imaging device (infrared CCD) for outputting an electrical signal corresponding to the infrared light captured by the optical system. An image signal output from the imaging means 73 is transmitted to control means (not shown).

Figure 7:
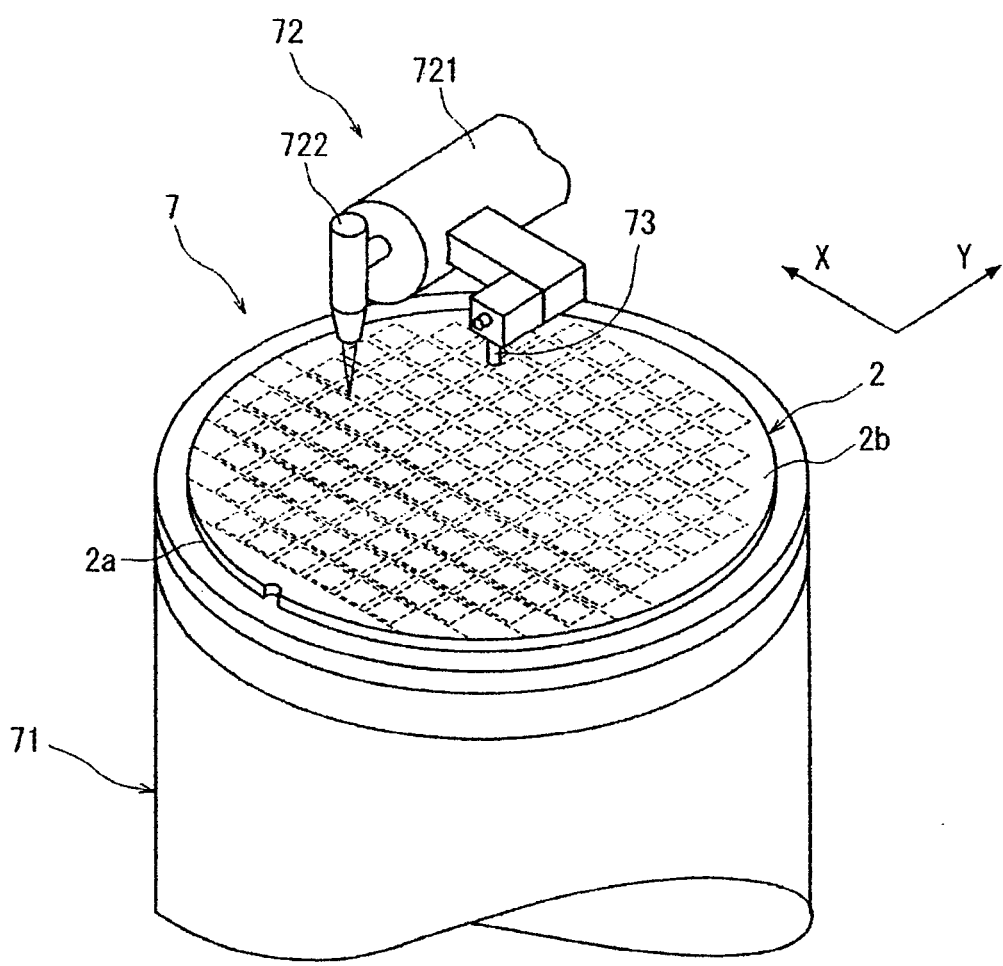
FIG. 7 is a perspective view of an essential part of a laser processing apparatus for performing a modified layer forming step.

The modified layer forming step using the laser processing apparatus 7 will now be described with reference to FIGS. 7 to 8B. First, the semiconductor wafer 2 is placed on the chuck table 71 of the laser processing apparatus 7 shown in FIG. 7 in the condition where the front side 2a of the semiconductor wafer 2 is in contact with the upper surface of the chuck table 71. Thereafter, suction means (not shown) is operated to hold the semiconductor wafer 2 on the chuck table 71 under suction (wafer holding step). Accordingly, the back side 2b of the semiconductor wafer 2 held on the chuck table 71 is oriented upward. Thereafter, the chuck table 71 holding the semiconductor wafer 2 is moved to a position directly below the imaging means 73 by operating the moving mechanism (not shown).

In the condition where the chuck table 71 is positioned directly below the imaging means 73, an alignment operation is performed by the imaging means 73 and the control means (not shown) to detect a subject area of the semiconductor wafer 2 to be laser-processed. More specifically, the imaging means 73 and the control means perform image processing such as pattern matching for making the alignment of the division lines 21 extending in the first direction on the semiconductor wafer 2 and the focusing means 722 of the laser beam applying means 72 for applying the laser beam to the wafer 2 along the division lines 21, thus performing the alignment of a laser beam applying position (alignment step). Similarly, this alignment step is performed for the other division lines 21 extending in the second direction perpendicular to the first direction on the semiconductor wafer 2. Although the front side 2a of the semiconductor wafer 2 on which the division lines 21 are formed is oriented downward, the division lines 21 can be imaged through the semiconductor wafer 2 from the back side 2b thereof because the imaging means 73 includes the infrared light applying means for applying infrared light to the wafer 2, the optical system for capturing the infrared light applied to the wafer 2, and the imaging device (infrared CCD) for outputting an electrical signal corresponding to the infrared light captured by the optical system as described above.

Figure 8A:
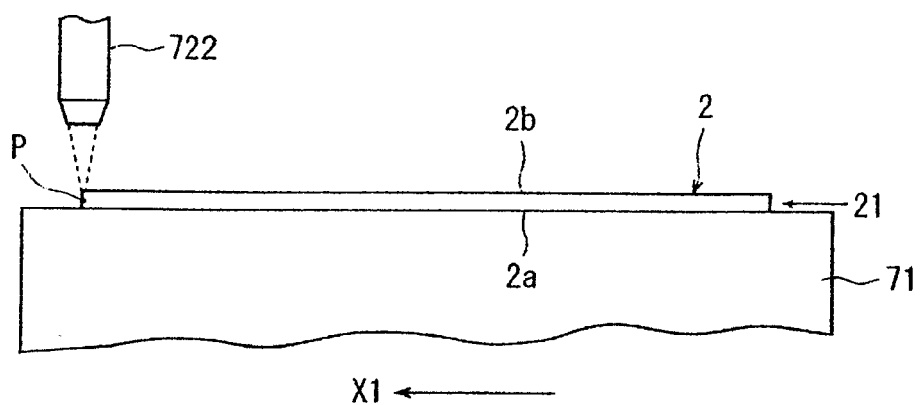
FIGS. 8A and 8B are sectional side views for illustrating the modified layer forming step.
Figure 8B:
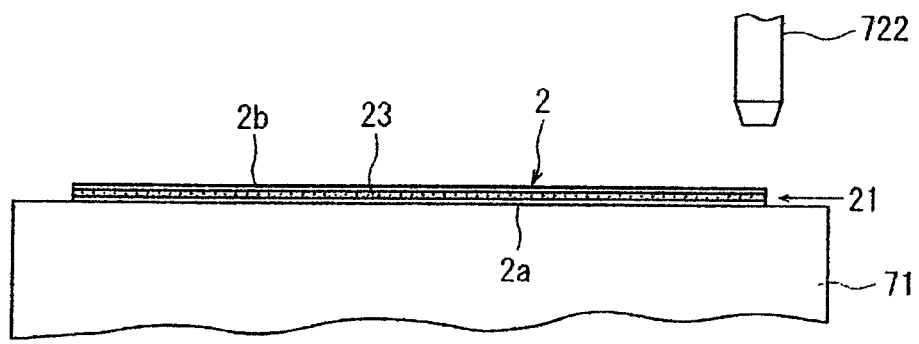

After performing the alignment step mentioned above to detect all of the division lines 21 of the semiconductor wafer 2 held on the chuck table 71, the chuck table 71 is moved to a laser beam applying area where the focusing means 722 of the laser beam applying means 72 is located as shown in FIG. 8A, thereby positioning one end (left end as viewed in FIG. 8A) of a predetermined one of the division lines 21 extending in the first direction directly below the focusing means 722. Further, the focal point P of the pulsed laser beam to be applied from the focusing means 722 is set at an intermediate position in the direction along the thickness of the semiconductor wafer 2. Thereafter, the pulsed laser beam having a transmission wavelength to the semiconductor wafer 2 (silicon wafer) is applied from the focusing means 722 to the semiconductor wafer 2, and the chuck table 71 is moved at a predetermined feed speed in the direction shown by an arrow X1 in FIG. 8A. When the other end (right end as viewed in FIG. 8B) of the predetermined division line 21 reaches the position directly below the focusing means 722 as shown in FIG. 8B, the application of the pulsed laser beam is stopped and the movement of the chuck table 71 is also stopped. As a result, a modified layer 23 is formed inside the semiconductor wafer 2 along the predetermined division line 21.

For example, the modified layer forming step mentioned above is performed under the following processing conditions.

Light source: YAG pulsed laser
Wavelength: 1064 nm
Repetition frequency: 100 kHz
Average power: 0.3 W
Focused spot diameter: 1 μm
Work feed speed: 100 mm/second After performing the modified layer forming step along the predetermined division line 21 as mentioned above, the chuck table 71 is moved in the indexing direction shown by the arrow Y in FIG. 7 by the pitch of the division lines 21 formed on the semiconductor wafer 2 (indexing step), and the modified layer forming step is similarly performed along the next division line 21 extending in the first direction. In this manner, the modified layer forming step is performed along all of the division lines 21 extending in the first direction. Thereafter, the chuck table 71 is rotated 90 degrees to similarly perform the modified layer forming step along all of the other division lines 21 extending in the second direction perpendicular to the first direction.

Figure 9A:
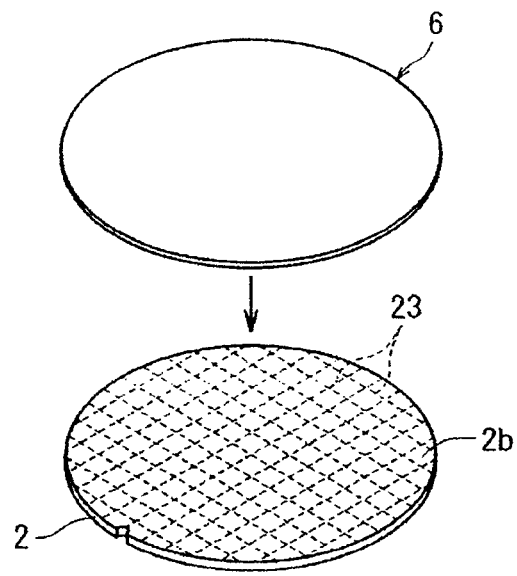
FIGS. 9A to 9C are perspective views for illustrating a third preferred embodiment of the wafer supporting step.
Figure 9B:
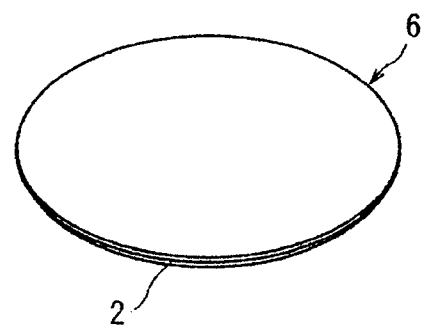
Figure 9C:
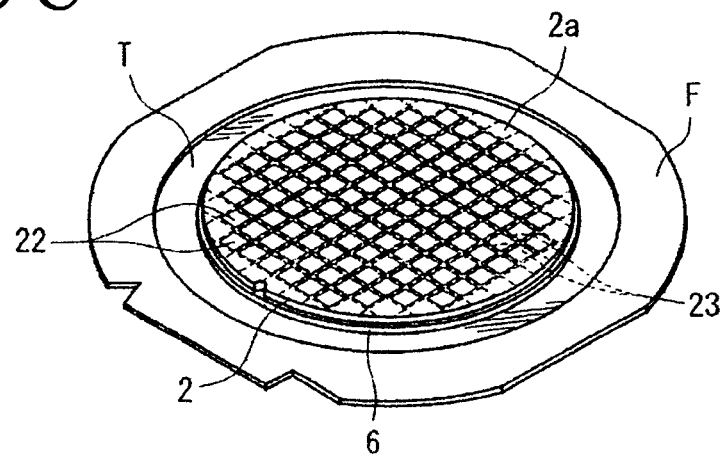

After performing the modified layer forming step mentioned above, the wafer supporting step mentioned above is similarly performed in such a manner that an adhesive film is mounted on the back side 2b of the semiconductor wafer 2, a dicing tape is attached to the adhesive film, and the peripheral portion of the dicing tape is supported to an annular frame. A third preferred embodiment of the wafer supporting step will now be described with reference to FIGS. 9A to 9C. As shown in FIGS. 9A and 9B, an adhesive film 6 is mounted on the back side 2b of the semiconductor wafer 2 processed by the modified layer forming step (adhesive film mounting step). The adhesive film 6 must be reliably mounted on the entire surface of the back side 2b of the semiconductor wafer 2, so that the adhesive film 6 has a size slightly larger than the size of the semiconductor wafer 2. After mounting the adhesive film 6 on the back side 2b of the semiconductor wafer 2 as mentioned above, the adhesive film 6 mounted on the back side 2b of the semiconductor wafer 2 is attached to an expansible dicing tape T supported at its peripheral portion to an annular frame F as shown in FIG. 9C. While the adhesive film 6 mounted on the back side 2b of the semiconductor wafer 2 is attached to the dicing tape T supported to the annular frame F in the third preferred embodiment shown in FIGS. 9A to 9C, the dicing tape T may be attached to the adhesive film 6 mounted on the back side 2b of the semiconductor wafer 2, and at the same time the peripheral portion of the dicing tape T may be supported to the annular frame F.

Figure 10A:
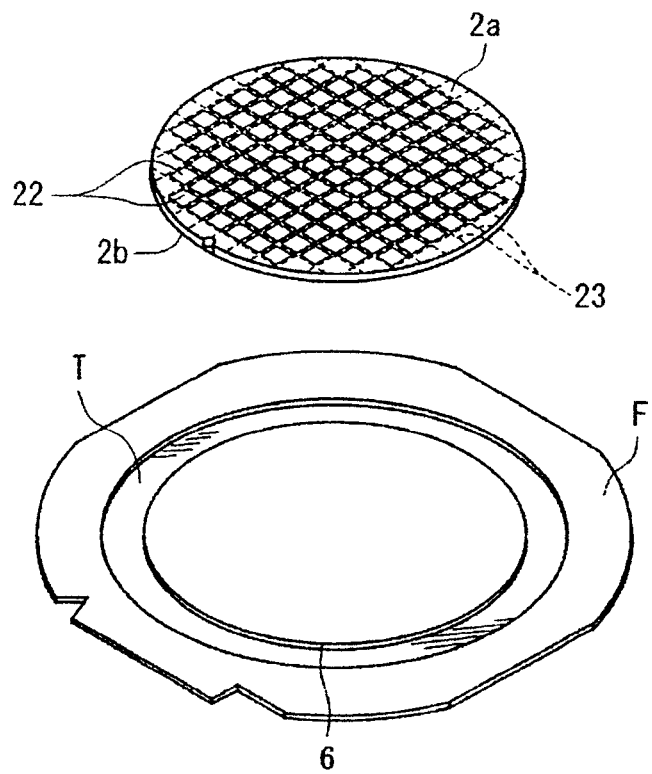
FIGS. 10A and 10B are perspective views for illustrating a fourth preferred embodiment of the wafer supporting step.
Figure 10B:
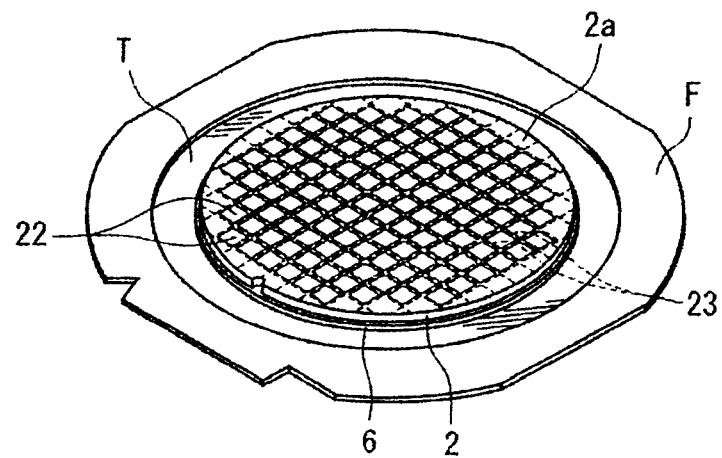

A fourth preferred embodiment of the wafer supporting step will now be described with reference to FIGS. 10A and 10B. In the fourth preferred embodiment shown in FIGS. 10A and 10B, an adhesive film 6 is preliminarily attached to a dicing tape T to prepare a dicing tape with adhesive film. More specifically, as shown in FIG. 10A, the dicing tape T is preliminarily supported at its peripheral portion to an annular frame F so as to close the central opening of the annular frame F, and the adhesive film 6 is preliminarily attached to the dicing tape T exposed to the central opening of the annular frame F. Thereafter, as shown in FIG. 10B, the back side 2b of the semiconductor wafer 2 processed by the modified layer forming step is mounted on the adhesive film 6 attached to the dicing tape T supported to the annular frame F, so that the semiconductor wafer 2 mounted on the adhesive film 6 is supported through the dicing tape T to the annular frame F. As similar to the third preferred embodiment shown in FIGS. 9A to 9C, the adhesive film 6 preliminarily attached to the dicing tape T must be reliably mounted on the entire surface of the back side 2b of the semiconductor wafer 2, so that the adhesive film 6 in the fourth preferred embodiment shown in FIGS. 10A and 10B also has a size slightly larger than the size of the semiconductor wafer 2. While the back side 2b of the semiconductor wafer 2 is mounted on the adhesive film 6 attached to the dicing tape T supported to the annular frame F in the fourth preferred embodiment shown in FIGS. 10A and 10B, the adhesive film 6 attached to the dicing tape T may be mounted on the back side 2b of the semiconductor wafer 2, and at the same time the peripheral portion of the dicing tape T may be supported to the annular frame F.

Figure 11:
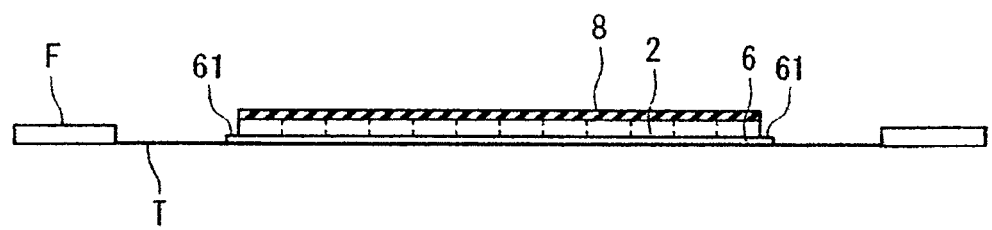
FIG. 11 is a sectional side view for illustrating a first preferred embodiment of a protective film forming step.

After performing the wafer supporting step mentioned above, a protective film forming step is performed in such a manner that a water-soluble resin is applied to the front side 2a of the semiconductor wafer 2 and/or the peripheral portion of the adhesive film 6 projecting from the outer circumference of the semiconductor wafer 2, thereby forming a protective film from the water-soluble resin. First to third preferred embodiments of the protective film forming step will now be described with reference to FIGS. 11 to 13. In the first preferred embodiment shown in FIG. 11, a water-soluble resin is applied to the front side 2a of the semiconductor wafer 2, thereby forming a protective film 8 fully covering the front side 2a. Examples of the water-soluble resin for forming the protective film 8 include polyvinyl alcohol (PVA), water-soluble phenol resin, and acrylic water-soluble resin. The first preferred embodiment of the protective film forming step may be performed between the division groove forming step and the protective member attaching step. Further, the first preferred embodiment of the protective film forming step may be performed between the modified layer forming step and the wafer supporting step.

Figure 12:
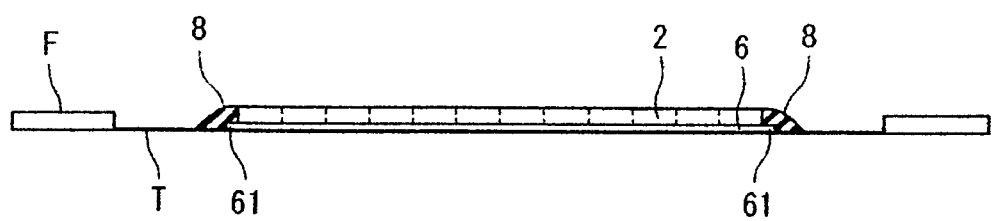
FIG. 12 is a sectional side view for illustrating a second preferred embodiment of the protective film forming step.

In the second preferred embodiment shown in FIG. 12, a water-soluble resin is applied to the peripheral portion 61 of the adhesive film 6 projecting from the outer circumference of the semiconductor wafer 2, thereby forming a protective film 8 fully covering the peripheral portion 61.

Figure 13:
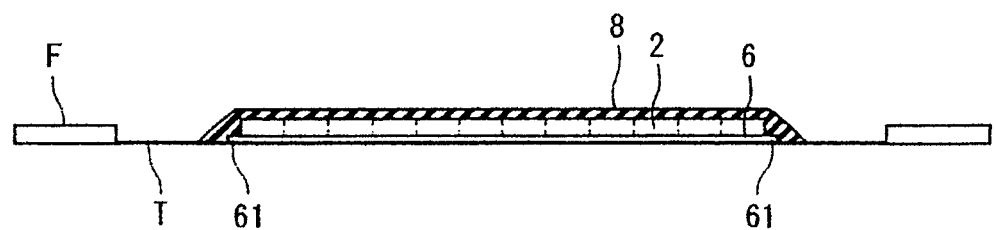
FIG. 13 is a sectional side view for illustrating a third preferred embodiment of the protective film forming step.

In the third preferred embodiment shown in FIG. 13, a water-soluble resin is applied to both the front side 2a of the semiconductor wafer 2 and the peripheral portion 61 of the adhesive film 6 projecting from the outer circumference of the semiconductor wafer 2, thereby forming a protective film 8 fully covering the front side 2a and the peripheral portion 61.

Figure 14:
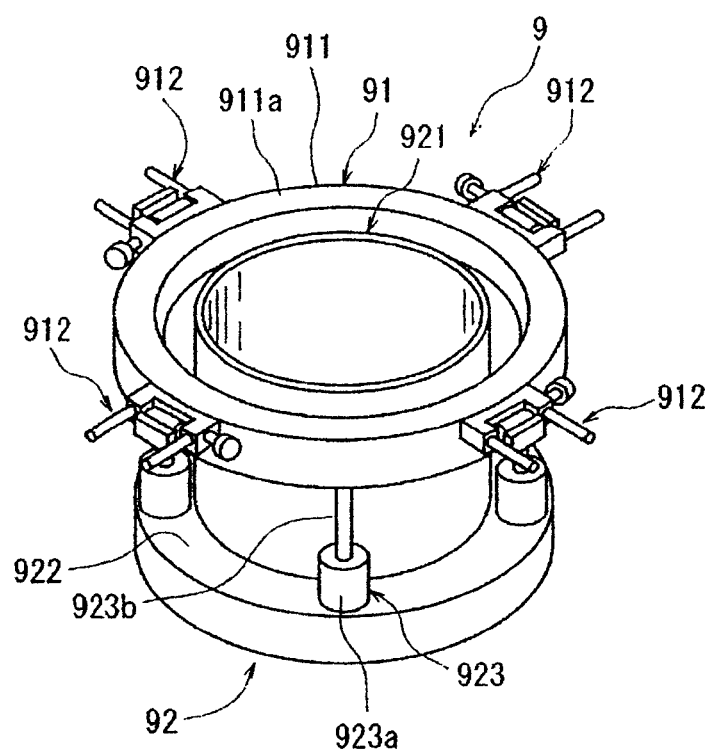
FIG. 14 is a perspective view of a tape expanding apparatus for performing an adhesive film breaking step.

After performing the protective film forming step mentioned above, an adhesive film breaking step is performed in such a manner that the dicing tape T is expanded to thereby break the adhesive film 6 along the individual device chips 220. This adhesive film breaking step is performed by using a tape expanding apparatus 9 shown in FIG. 14. The tape expanding apparatus 9 shown in FIG. 14 includes frame holding means 91 for holding the annular frame F and tape expanding means 92 for expanding the dicing tape T supported to the annular frame F held by the frame holding means 91. The frame holding means 91 includes an annular frame holding member 911 and a plurality of clamps 912 as fixing means provided on the outer circumference of the frame holding member 911. The upper surface of the frame holding member 911 functions as a mounting surface 911a for mounting the annular frame F thereon. The annular frame F mounted on the mounting surface 911a is fixed to the frame holding member 911 by the clamps 912. The frame holding means 91 is supported by the tape expanding means 91 so as to be vertically movable.

Figure 15A:
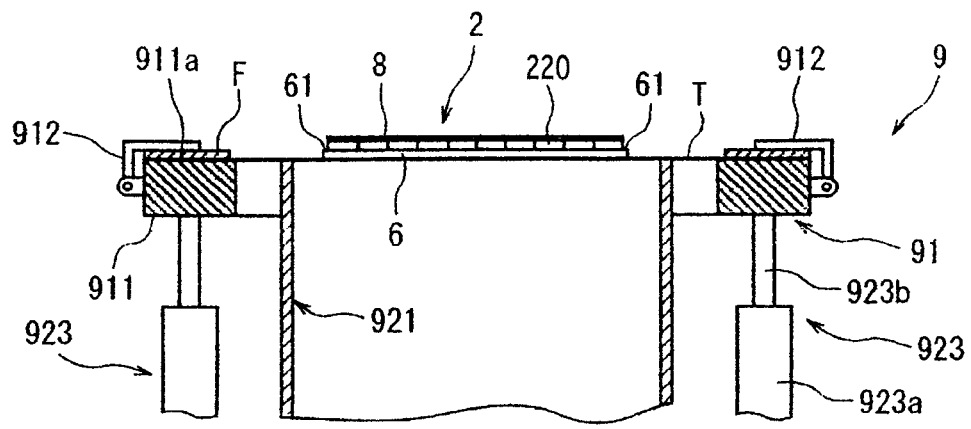
FIGS. 15A and 15B are sectional side views for illustrating a first preferred embodiment of the adhesive film breaking step.

The tape expanding means 92 includes an expanding drum 921 provided inside of the annular frame holding member 911. The expanding drum 921 has an outer diameter smaller than the inner diameter of the annular frame F and an inner diameter larger than the outer diameter of the semiconductor wafer 2 attached to the dicing tape T supported to the annular frame F. The expanding drum 921 has a supporting flange 922 at the lower end of the drum 921. The tape expanding means 92 further includes supporting means 923 for vertically movably supporting the annular frame holding member 911. The supporting means 923 is composed of a plurality of air cylinders 923a provided on the supporting flange 922. Each air cylinder 923a is provided with a piston rod 923b connected to the lower surface of the annular frame holding member 911. The supporting means 923 composed of these plural air cylinders 923a functions to vertically move the annular frame holding member 911 so as to selectively take a reference position where the mounting surface 911a is substantially equal in height to the upper end of the expanding drum 921 as shown in FIG. 15A and an expansion position where the mounting surface 911a is lower in height than the upper end of the expanding drum 921 by a predetermined amount as shown in FIG. 15B.

A first preferred embodiment of the adhesive film breaking step using the tape expanding apparatus 9 will now be described with reference to FIGS. 15A and 15B. The first preferred embodiment of the adhesive film breaking step is applied to the case shown in FIG. 11, wherein the water-soluble resin is applied to the front side 2a of the semiconductor wafer 2 to form the protective film 8. As shown in FIG. 15A, the annular frame F supporting the semiconductor wafer 2 through the dicing tape T is mounted on the mounting surface 911a of the frame holding member 911 of the frame holding means 91 and fixed to the frame holding member 911 by the clamps 912 (frame holding step). At this time, the frame holding member 911 is set at the reference position shown in FIG. 15A.

Figure 15B:
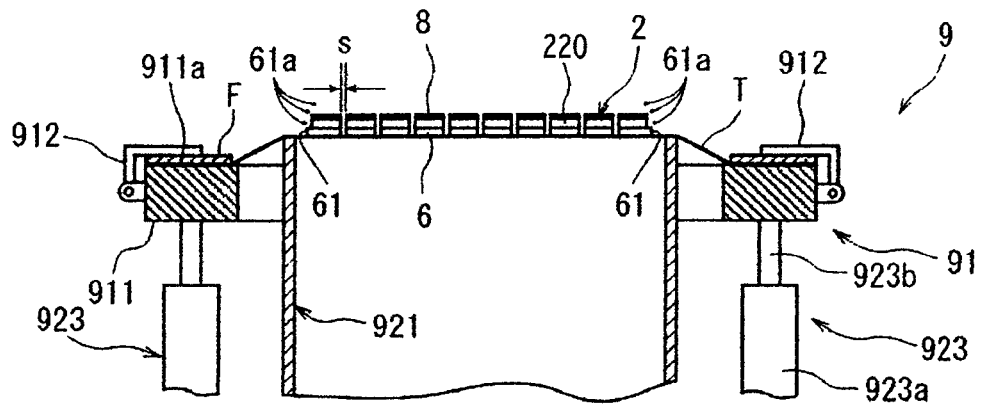

Thereafter, the air cylinders 923a as the supporting means 923 of the tape expanding means 92 are operated to lower the frame holding member 911 to the expansion position shown in FIG. 15B. Accordingly, the annular frame F fixed to the mounting surface 911a of the frame holding member 911 is also lowered, so that the dicing tape T supported to the annular frame F comes into abutment against the upper end of the expanding drum 921 and is expanded as shown in FIG. 15B (tape expanding step). Accordingly, a spacing S is formed between any adjacent ones of the individual device chips 220 divided from each other as shown in FIG. 15B, wherein the semiconductor wafer 2 attached through the adhesive film 6 to the dicing tape T has already been divided along the division lines 21. As a result, the adhesive film 6 mounted on the back side 2b of the semiconductor wafer 2 is broken along the device chips 220, so that the adhesive film 6 is divided along the division lines 21 as shown in FIG. 15B. In the case that the semiconductor wafer 2 attached through the adhesive film 6 to the dicing tape T is a semiconductor wafer processed by the modified layer forming step mentioned above, a tensile force acts on the semiconductor wafer 2 through the adhesive film 6 due to the expansion of the dicing tape T. Accordingly, the semiconductor wafer 2 is divided along the division lines 21 where the modified layers 23 (see FIGS. 8A to 9C) are formed as the break start point, thereby obtaining the individual device chips 220. At the same time, the adhesive film 6 mounted on the back side 2b of the semiconductor wafer 2 is broken along the device chips 220, so that the adhesive film 6 is divided along the division lines 21.

At the time of breaking the adhesive film 6 along the device chips 220, there is a possibility that the peripheral portion 61 of the adhesive film 6 projecting from the outer circumference of the semiconductor wafer 2 may be partially crushed to scatter as shown by reference numerals 61a in FIG. 15B, so that the crushed part 61a of the peripheral portion 61 of the adhesive film 6 may fall on the front side of the device chips 220. However, since the protective film 8 is formed on the front side of the device chips 220, the crushed part 61a of the peripheral portion 61 of the adhesive film 6 sticks to the front side (upper surface) of the protective film 8 formed on the front side of the device chips 220 and does not directly stick to the front side of the device chips 220. Accordingly, by removing the protective film 8 formed on the front side of the device chips 220 in the next step, the crushed part 61a sticking to the protective film 8 can be removed, thereby preventing a reduction in quality of the device chips 220.

Figure 16A:
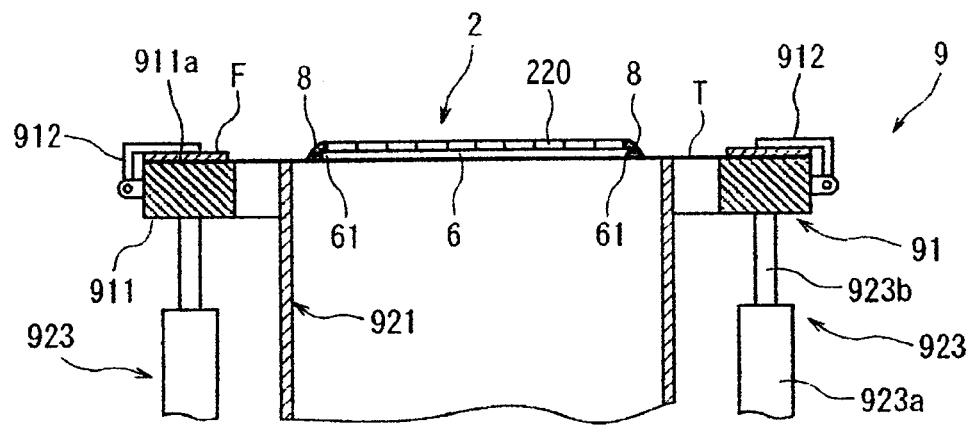
FIGS. 16A and 16B are sectional side views for illustrating a second preferred embodiment of the adhesive film breaking step.
Figure 16B:
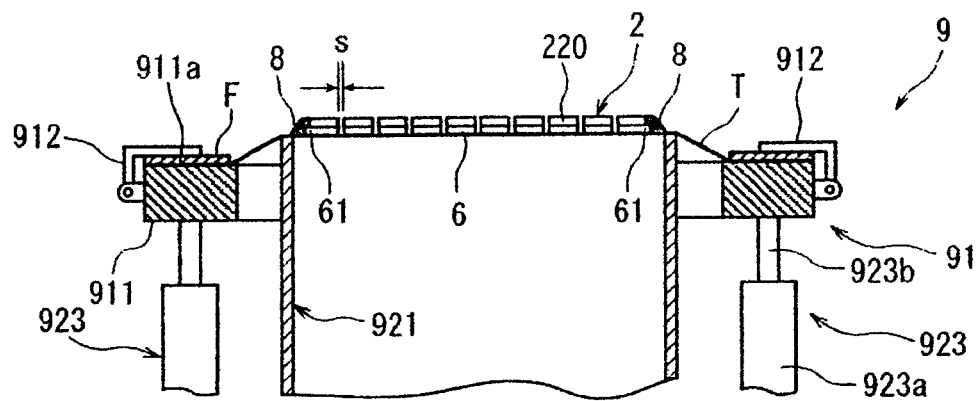

A second preferred embodiment of the adhesive film breaking step using the tape expanding apparatus 9 will now be described with reference to FIGS. 16A and 16B. The second preferred embodiment of the adhesive film breaking step is applied to the case shown in FIG. 12, wherein the water-soluble resin is applied to the peripheral portion 61 of the adhesive film 6 projecting from the outer circumference of the semiconductor wafer 2 to form the protective film 8. As shown in FIG. 16A, the annular frame F supporting the semiconductor wafer 2 through the dicing tape T is mounted on the mounting surface 911a of the frame holding member 911 of the frame holding means 91 and fixed to the frame holding member 911 by the clamps 912 (frame holding step). At this time, the frame holding member 911 is set at the reference position shown in FIG. 16A. Thereafter, the air cylinders 923a as the supporting means 923 of the tape expanding means 92 are operated to lower the frame holding member 911 to the expansion position shown in FIG. 16B. Accordingly, the annular frame F fixed to the mounting surface 911a of the frame holding member 911 is also lowered, so that the dicing tape T supported to the annular frame F comes into abutment against the upper end of the expanding drum 921 and is expanded as shown in FIG. 16B (tape expanding step). Accordingly, a spacing S is formed between any adjacent ones of the individual device chips 220 divided from each other as shown in FIG. 16B, wherein the semiconductor wafer 2 attached through the adhesive film 6 to the dicing tape T has already been divided along the division lines 21. As a result, the adhesive film 6 mounted on the back side 2b of the semiconductor wafer 2 is broken along the device chips 220, so that the adhesive film 6 is divided along the division lines 21 as shown in FIG. 16B.

In the case that the semiconductor wafer 2 attached through the adhesive film 6 to the dicing tape T is a semiconductor wafer processed by the modified layer forming step mentioned above, a tensile force acts on the semiconductor wafer 2 through the adhesive film 6 due to the expansion of the dicing tape T. Accordingly, the semiconductor wafer 2 is divided along the division lines 21 where the modified layers 23 (see FIGS. 8A to 9C) are formed as the break start point, thereby obtaining the individual device chips 220. At the same time, the adhesive film 6 mounted on the back side 2b of the semiconductor wafer 2 is broken along the device chips 220, so that the adhesive film 6 is divided along the division lines 21. At the time of breaking the adhesive film 6 along the device chips 220, there is a possibility that the peripheral portion 61 of the adhesive film 6 projecting from the outer circumference of the semiconductor wafer 2 may be partially crushed. However, since the peripheral portion 61 of the adhesive film 6 is fully covered with the protective film 8, there is no possibility that a crushed part of the peripheral portion 61 may scatter. Accordingly, there is no possibility that the crushed part of the peripheral portion 61 of the adhesive film 6 may stick to the front side of the device chips 220.

In the case of applying the adhesive film breaking step to the preferred embodiment shown in FIG. 13, wherein the water-soluble resin is applied to both the front side 2a of the semiconductor wafer 2 and the peripheral portion 61 of the adhesive film 6 projecting from the outer circumference of the semiconductor wafer 2 to form the protective film 8, an effect similar to that in the second preferred embodiment of the adhesive film breaking step shown in FIGS. 16A and 16B can be obtained. In addition, even when any scattered substance is present, the scattered substance sticks to the front side of the protective film 8 and does not directly stick to the front side of the device chips 220 as in the first preferred embodiment of the adhesive film breaking step shown in FIGS. 15A and 15B. Accordingly, by removing the protective film 8 formed on the front side of the device chips 220 in the next step, the scattered substance sticking to the protective film 8 can be removed, thereby preventing a reduction in quality of the device chips 220.

Figure 17A:
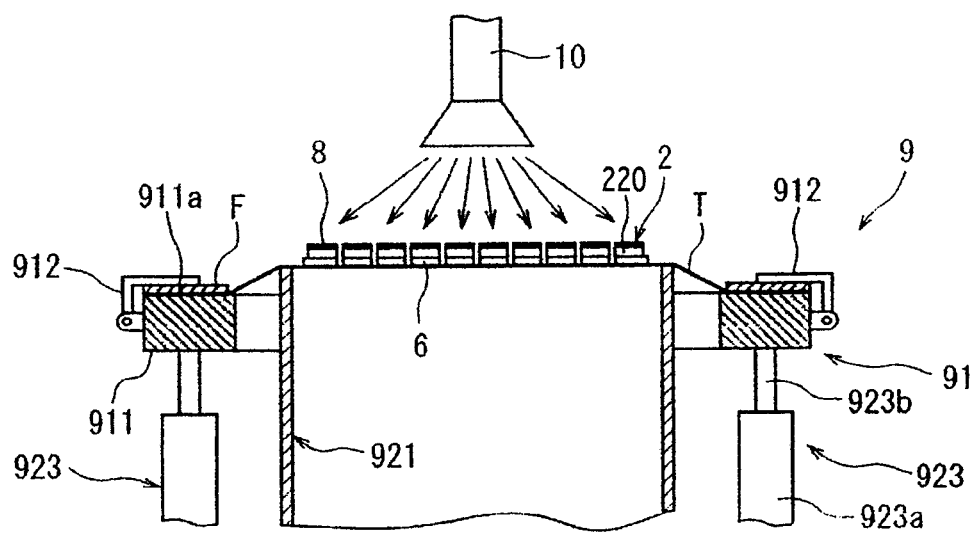
FIGS. 17A and 17B are sectional side views for illustrating a protective film removing step.
Figure 17B:
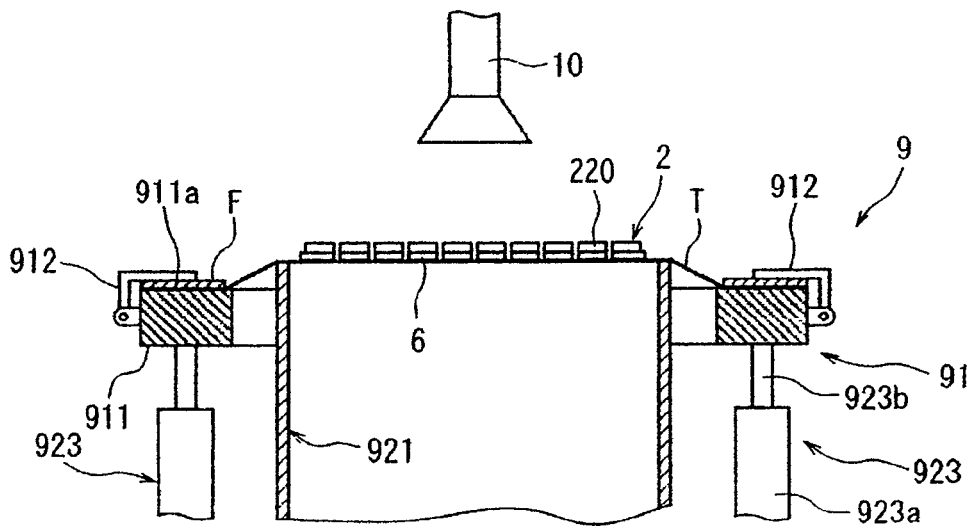

After performing the adhesive film breaking step mentioned above, a protective film removing step is performed in such a manner that a cleaning water is supplied to the protective film 8 formed on the front side of the individual device chips 220, thereby removing the protective film 8. As shown in FIG. 17A, a cleaning water nozzle 10 for supplying a cleaning water is positioned directly above the tape expanding apparatus 9 in the condition shown in FIG. 15B (or FIG. 16B). Thereafter, the cleaning water is supplied from the cleaning water nozzle 10 to the front side (upper surface) of the protective film 8 formed on the front side of the individual device chips 220 attached through the adhesive film 6 to the dicing tape T supported to the annular frame F. As a result, the protective film 8 which is formed of a water-soluble resin can be easily removed by the cleaning water as shown in FIG. 17B, so that the crushed part 61a of the peripheral portion 61 of the adhesive film 6 sticking to the front side of the protective film 8 can also be removed together with the protective film 8. Accordingly, there is no possibility that a part of the adhesive film 6 (i.e., debris scattered from the peripheral portion 61 of the adhesive film 6) may stick to the front side of each device chip 220 to cause a reduction in quality of the device chips 220.

Although not shown, a pickup step is performed after performing the protective film removing step. That is, each device chip 220 with the adhesive film 6 mounted on the back side is peeled from the dicing tape T in the pickup step.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A wafer processing method of dividing a wafer into a plurality of individual device chips along a plurality of crossing division lines and mounting an adhesive film for die bonding on a back side of each device chip, said plurality of crossing division lines being formed on a front side of said wafer to thereby define a plurality of separate regions where a plurality of devices are respectively formed, said wafer processing method comprising:

a wafer supporting step of mounting said adhesive film on a back side of said wafer, attaching a dicing tape to said adhesive film, and supporting a peripheral portion of said dicing tape to an annular frame, wherein said wafer has already been divided along said division lines or a break start point has already been formed inside said wafer along each division line;

a protective film forming step of applying a water-soluble resin to the front side of said wafer and/or a peripheral portion of said adhesive film projecting from an outer circumference of said wafer, thereby forming a protective film from said water-soluble resin; and an adhesive film breaking step of expanding said dicing tape to thereby break said adhesive film along said individual device chips after performing said protective film forming step.

2. The wafer processing method according to claim 1, further comprising:

a division groove forming step of forming a division groove having a depth corresponding to a finished thickness of each device chip along each division line on the front side of said wafer before performing said adhesive film breaking step;

a protective member attaching step of attaching a protective member to the front side of said wafer after performing said division groove forming step; and a back grinding step of grinding the back side of said wafer until said division groove extending along each division line is exposed to the back side of said wafer after performing said protective member attaching step, thereby dividing said wafer into said individual device chips.

3. The wafer processing method according to claim 2, wherein said protective film forming step is performed between said division groove forming step and said protective member attaching step.

4. The wafer processing method according to claim 1, further comprising a modified layer forming step of applying a laser beam having a transmission wavelength to said wafer from the back side of said wafer along each division line in a condition where a focal point of said laser beam is set inside said wafer to thereby form a modified layer as said break start point inside said wafer along each division line before performing said wafer supporting step.

5. The wafer processing method according to claim 1, further comprising a protective film removing step of supplying a cleaning water to said protective film after performing said adhesive film breaking step, thereby removing said protective film.

* * * * *